United States Patent
Konrad et al.

(10) Patent No.: US 6,919,514 B2
(45) Date of Patent: *Jul. 19, 2005

(54) STRUCTURE HAVING LASER ABLATED FEATURES AND METHOD OF FABRICATING

(75) Inventors: John Joseph Konrad, Endicott, NY (US); Jeffrey McKeveny, Endicott, NY (US); James Warren Wilson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/661,552

(22) Filed: Sep. 15, 2003

(65) Prior Publication Data

US 2004/0064939 A1 Apr. 8, 2004

Related U.S. Application Data

(62) Division of application No. 09/804,921, filed on Mar. 13, 2001, now Pat. No. 6,730,857.

(51) Int. Cl.⁷ .................................................. H05K 1/00
(52) U.S. Cl. ..................... 174/258; 174/254; 174/255
(58) Field of Search ................................ 174/255, 256, 174/257, 258, 260, 261, 250, 117 F, 254, 117 FF; 361/792, 795; 29/852

(56) References Cited

U.S. PATENT DOCUMENTS

| | | | |
|---|---|---|---|
| 3,149,265 A | 9/1964 | Thorn | |
| 3,324,014 A | 6/1967 | Modjeska | |
| 3,622,384 A | * 11/1971 | Davey et al. | 428/201 |
| 4,306,925 A | 12/1981 | Lebow et al. | |
| 4,875,282 A | 10/1989 | Leibowitz | |
| 4,915,983 A | * 4/1990 | Lake et al. | 427/98 |
| 4,970,354 A | * 11/1990 | Iwasa et al. | 174/257 |
| 5,004,640 A | 4/1991 | Nakatani et al. | |
| 5,456,817 A | 10/1995 | Hino et al. | |
| 5,620,800 A | 4/1997 | De Leeuw et al. | |
| 5,647,966 A | 7/1997 | Uriu et al. | |
| 5,714,050 A | 2/1998 | Akiba et al. | |
| 5,821,168 A | 10/1998 | Jain | |
| 5,822,850 A | 10/1998 | Odaira et al. | |
| 5,830,533 A | 11/1998 | Lin et al. | |
| 5,863,405 A | 1/1999 | Miyashita | |
| 5,891,513 A | 4/1999 | Dubin et al. | |
| 5,976,393 A | 11/1999 | Abe | |
| 6,183,669 B1 | 2/2001 | Kunota et al. | |
| 6,274,821 B1 | * 8/2001 | Echigo et al. | 174/255 |
| 6,323,435 B1 | * 11/2001 | Strandberg et al. | 174/255 |
| 6,335,077 B1 | 1/2002 | Tani et al. | |
| 6,586,682 B2 | * 7/2003 | Strandberg | 174/255 |

FOREIGN PATENT DOCUMENTS

| | | |
|---|---|---|
| EP | 0935407 | 8/1999 |
| JP | 09068383 | 10/1998 |
| WO | WO-099/47731 | 9/1999 |

* cited by examiner

*Primary Examiner*—Randy Gibson
*Assistant Examiner*—Ishwar (I. B.) Patel
(74) *Attorney, Agent, or Firm*—Connolly, Bove, Lodge, Hutz, LLP; Ronald Kaschak

(57) ABSTRACT

Embedded flush circuitry features are provided by providing a conductive seed layer on the sidewalls and bottom of laser ablated trench features plating a layer of conductive metal onto the seed layer and depositing a layer of dielectric material.

12 Claims, 2 Drawing Sheets

STRUCTURE HAVING LASER ABLATED FEATURES AND METHOD OF FABRICATING

CROSS-REFERENCE TO RELATED APPLICATION

The present application is a continuation of U.S. patent application Ser. No. 09/804,921 filed Mar. 13, 2001, now U.S. Pat. No. 6,730,857.

FIELD OF THE INVENTION

The present invention relates to providing a structure having circuitry features and in particular to embedded flush circuitry features. The present invention is especially advantageous for fabricating buried interconnection levels that are in close proximity to one another in a printed circuit board structure.

BACKGROUND OF THE INVENTION

Printed circuit boards find a wide variety of uses in the electronics industry with the demand for high performance, printed wiring, or circuit boards for various applications steadily increasing. For instance, the complexity, compactness and electrical performance requirements of printed boards have significantly increased over the last several years. The demands on printed circuit boards require high density packaging, fine interconnection, multilayer formation and the need to form a plurality of interconnections in a small space.

Currently, printed circuit board interconnection levels are built on top of a dielectric thin film layer. Circuitry features are formed using photolithographic and subtractive etch techniques. In a typical method, a metallic foil and especially copper foil is laminated to the substrate followed by using photolithographic and subtractive etching to create the circuitry. The copper foil includes a roughened or dendritic backside surface for inducing mechanical adhesion to the substrate. Smooth copper layers do not adequately bond without an auxiliary bonding agent.

Great difficulties exist in adequately etching dendrites especially when dealing with small spaces. Moreover, along with the concern created by dendrites, the width of the lines (e.g. about 0.5 mils wide), and photolithographic issues (e.g. resolution of fine features, 0.7 mil wire with 1.1 mil space, in a thin photo resist film), and subtractive etch undercut/pad rounding, render clearly and fully resolving small line spaces such as the 1.8 mil pitch features presently desired very difficult. Additionally, this subtractive etch approach results in unprotected circuitry features referred to as "skyscrapers" that extend above an underlying plane of dielectric barrier material.

In many structures, it is important to plate another metal such as gold or nickel-gold onto the copper circuitry. The "skyscraper" structure causes a problem of bridging or shorting between lines especially where there exist closely spaced fingers.

SUMMARY OF THE INVENTION

The present invention provides for obtaining a structure having dense embedded flush circuitry features. The present invention makes it possible to create circuitry features that are much more densely configured than those fabricated using current methods. This is made possible since the final structure is a circuitry feature having dielectric regions and conductive features that are coplanar.

In particular, the present invention relates to a structure comprising a first dielectric layer of a polymeric material having a first top surface; a second dielectric layer of polymeric material on said first top surface of said first dielectric layer of a polymeric material, having a second top surface, said second layer of polymeric material also having trench features therein; electrically conductive material deposited in said trench features forming electrically conductive circuit lines and being substantially flush with said second top surface of said second dielectric layer of polymeric material.

Another aspect of the present invention relates to a method for fabricating a structure having embedded substantially flush circuit features. The method comprises providing a first dielectric layer of a polymeric material with a top surface; depositing a second dielectric layer of polymeric material on said top surface of first dielectric layer of a polymeric material, said second dielectric layer of polymeric material also having a second top surface; defining trench features with sidewalls and bottoms, substantially in said second dielectric layer of polymeric material; providing a seed layer only on said sidewalls and bottoms of said trench features; depositing electrically conductive material in said trench features such that said electrically conductive material is substantially coplanar with said top surface of said second dielectric layer of polymeric material.

A still further aspect of the present invention related to another method for fabricating a structure having embedded substantially flush circuitry features which method comprises:

providing a first layer of polymer resin having a metal dispersed therein and having a top surface;

depositing a second dielectric layer of a dielectric polymeric material on said top surface of said first layer of polymer resin, said second dielectric layer of a dielectric polymeric material also having a second top surface;

defining trench features with sidewalls and bottoms, substantially in said second dielectric layer of a dielectric polymeric material and into said first layer of dielectric polymer resin and thereby exposing metal in sidewalls and bottoms of said trench features to provide a seed layer;

depositing electrically conductive material in said trench features such that the electrically conductive material is substantially coplanar with said second top surface of said second dielectric layer of dielectric polymeric material.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

The present invention also relates to structures obtained by the above-disclosed processes.

BEST AND VARIOUS MODES FOR CARRYING OUT INVENTION

In order to facilitate an understanding of the invention, reference will be made to the figures.

Figure 1A:
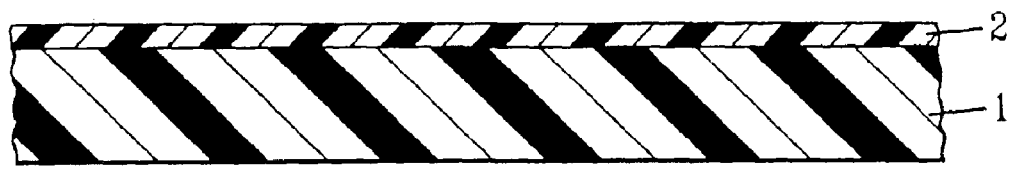
FIGS. 1a through 1e illustrate the structure of the present invention in various stages of fabrication according to one sequence of preparation.

The structure of the present invention having embedded flush or coplanar circuitry features can be produced by providing a flat, rigid dielectric layer of a first polymeric material (see FIG. 1a).

The dielectric substrate can be a thermoplastic resin or thermosetting resin. When a thermosetting resin is employed, it is in the uncured or partially cured (B-stage) until after the embedding is completed. At that point, the thermosetting resin can be fully cured.

Typical thermosetting resins include epoxy resins, polyimides, bis-maleimidetriazine resins, and melamine resins.

Typical thermoplastic resins include polyamides, polytrafluoroethylene resins, hexafluoropropylene resin, polyether sulfone resins and polyolefins such as polyethylene and polypropylene.

The dielectric substrate, if desired, can be reinforced such as with glass fibers or glass fabric.

Typically, the dielectric substrate is about 25 to about 250 microns and more typically about 50 to about 100 microns thick.

The preferred dielectric materials employed are epoxy resins and polyimide resins.

A second dielectric polymer 2 resin which can be the same as or different than the polymer of the dielectric layer 1 is deposited on the dielectric layer 1.

The dielectric polymer can be a thermoplastic resin or thermosetting resin. When a thermosetting resin is employed, it is in the uncured or partially cured (B-stage) until after the embedding is completed. At that point, the thermosetting resin can be fully cured.

Typical thermoplastic resins incude polyimides, polytetrafluoroethylene resins, and hexafluoropropylene resin, polyether sulfone resins and polyolefins such as polyethylene and polypropylene.

Typically the dielectric polymer layer 2 is up to about 20 microns thick, more typically about 5 to about 20 microns thick and even more typically about 5 to about 10 microns thick.

The preferred dielectric polymer layer 2 employed is an epoxy resin or a polyimide resin.

Figure 1B:
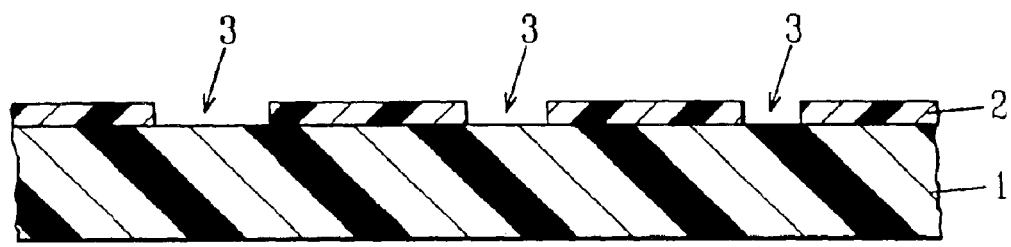

Trench features 3 are defined in the polymer resin layer 2 preferably by laser ablation. Typically the laser ablation is achieved by employing a focused laser beam to irradiate selected portions of the polymer surface. The energy of the focused laser beam removes the polymer by vaporizing and exploding away the material. A further discussion of laser ablating is not deemed necessary, since this step can be readily carried out by persons skilled in the art once aware of the present disclosure. See FIG. 1b.

The underlying dielectric substrate 1 can act as an automatic etch stop for the laser ablation when the polymer layer 2 and dielectric substrate 1 are different materials.

The trench features are typically relatively narrow such as being about 0.5 to about 1 mil wide, about 0.5 to about 2 mils spaced apart and up to 20 microns thick. More typically the trench features are about 5 to about 20 microns thick and preferably about 5 to 10 microns thick.

Figure 1C:
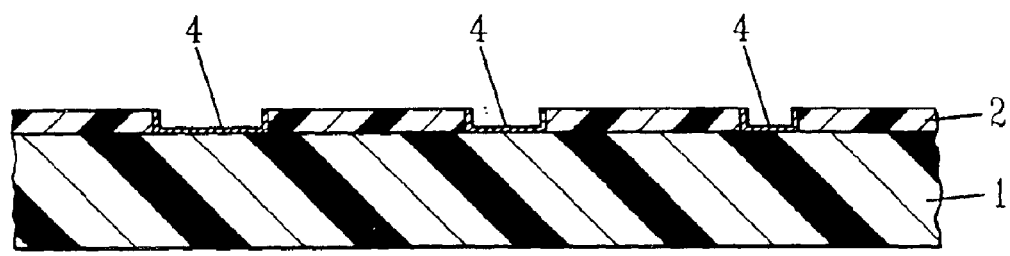

A relatively thin seed layer 4 of a conductive material is provided on only the sidewalls and bottoms of the trench features (see FIG. 1c).

Typical metals include copper and chromium with copper being preferred. The seed layer 4 is typically about 100 to about 5000 angstroms thick, a particular example being about 1000 angstroms. The seed layer can be deposited by blanket electroless plating, and then mechanically removed such as by polishing the seed layer 4 from all non-laser ablated surfaces. This results in leaving the seed layer only on the sidewalls and bottom of the trench features.

A copper seed layer 4 can also be provided by depositing copper form copper acetyl acetonate gas by laser deposition.

This results in deposition of copper only on the sidewalls and bottom of the trench features.

Figure 1D:
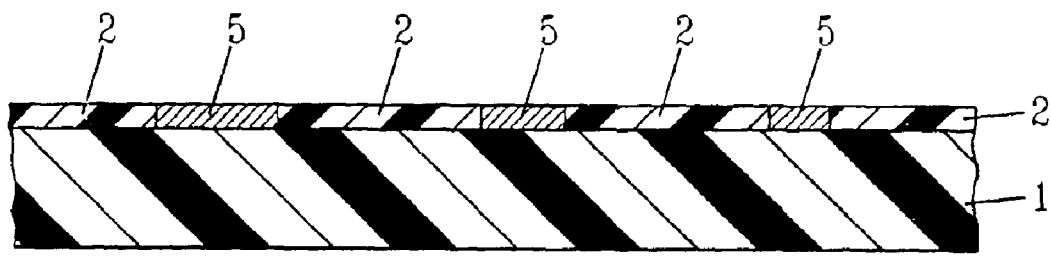

A conductive thin film 5 such as copper is then plated onto the seed layer. See FIG. 1d. The conductive film 5 is coplanar with the remaining polymer resin is typically up to about 20 microns, more typically about 5 to about 20 microns and preferably about 5 to about 10 microns. The conductive film can be deposited by electroless plating, or electroplating that are well known in the art. The preferred method of depositing the conductive film is by electroless plating.

Figure 1E:
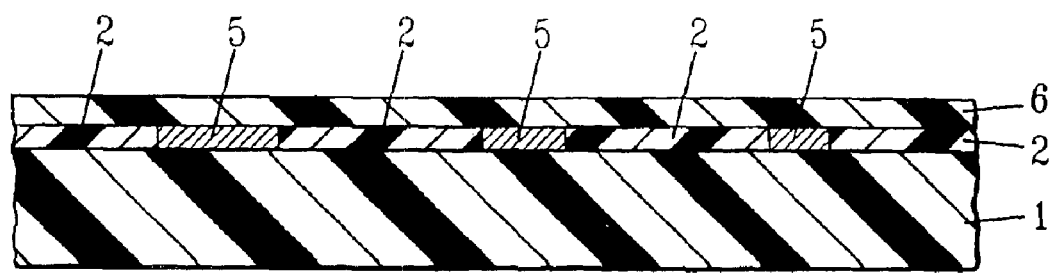

A dielectric inter layer 6 is then deposited on the structure (see FIG. 1e). The dielectric inter layer 6 can be any of the dielectric materials discussed above for layers 1 and 2. The preferred layer 6 is an epoxy or polymide. The dielectric inter layer 6 is typically applied by lamination of a film or by liquid coating.

The dielectric inter layer 6 is about 3 to about 20 microns thick, and more typically about 5 to about 10 microns thick, a typical example being about 10 microns thick.

Another method of the present invention for fabricating structures having embedded flush circuitry features is also provided. The method comprises providing a first layer of a dielectric polymer resin having a conductive metal dispersed therein. The dielectric polymer resin can be any of the dielectric polymer resins discussed above with epoxy resins and polyimides being preferred.

The conductive metal is preferably copper or chromium and most preferably copper. The conductive is typically in the form of a powder or as a particulate. The conductive metal typically has a particle size of about 10 to about 50 microns and more typically about 15 to about 20 microns.

The first dielectric polymer resin sheet is typically about 25 microns to about 250 microns and more typically about 50 microns to about 100 microns thick.

A second dielectric resin layer is next deposited on the first layer of dielectric polymer resin. The second dielectric resin layer is typically deposited by laminating a film or by liquid coating. The second dielectric polymer resin layer can be any of the dielectric polymer resins disclosed above.

The second dielectric polymer resin layer is typically 2 microns to about 20 microns, and more typically about 5 microns to about 10 microns thick.

Trench features are then defined in the second polymer resin layer and into the first dielectric polymer resin sheet. This is typically carried out by laser ablation. The laser ablation results in exposing metal in the sidewalls and bottom of the first dielectric polymer resin sheet to act as a seed layer.

The trench features are typically relatively narrow such as being about 0.5 to about 2 mils spaced apart and up to about 20 microns thick. More typically the trench features are about 5 to about 20 microns thick and preferably about 5 to about 10 microns thick.

Next the trench features are plated with a conductive material such that the conductive material is coplanar with the remaining second dielectric resin layer as discussed above, followed by depositing a dielectric inter layer as discussed above.

The sequence of steps of any of the above processes can be repeated multiple times until the desired number of circuit lines is provided.

In addition, if desired, the copper circuit lines can be plated with another conductive metal such as gold or nickel-gold as well known in the art.

Moreover, the multiple structure obtained pursuant to the above processing can then be joined together to form a multilayer circuit board.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit invention to the form disclosed herein. Also, it is intended that the appended claims be construed to include alternative embodiments.

What is claimed is:

1. An electronic structure having embedded substantially flush circuit features comprising:

a first dielectric layer of polymeric material having a first top surface:

a second dielectric layer of polymeric material on said first top surface of said first dielectric layer of polymeric material, having a second top surface, said second layer of polymeric material also having trench features therein, having a bottom and sidewalls;

a conductive seed layer located on said bottom and sidewalls;

and electrically conductive material deposited in said trench features forming electrically conductive circuit lines being substantially flush with said second top surface of said second dielectric layer of polymeric material, wherein said polymeric material is at least one member selected from the group consisting of thermoplastic resin and thermosetting resin, and further including a third dielectric layer of polymeric material located on said electrically conductive circuit lines, wherein the second dielectric layer of polymeric material is a different material than said first and third dielectric layer of polymeric material.

2. The electronic structure having embedded substantially flush circuit features, according to claim 1, wherein said first dielectric layer comprises:

a reinforcing material selected from the group consisting of glass fibers and glass fabric.

3. The electronic structure having embedded substantially flush circuit features, according to claim 1, wherein said circuit lines are up to about 20 microns thick.

4. The electronic structure having embedded substantially flush circuit features, according to claim 1, wherein said conductive material comprises copper.

5. The electronic structure having embedded substantially flush circuit features, according to claim 1, wherein said circuit lines are about 5 to about 20 microns thick.

6. The electronic structure having embedded substantially flush circuit features, according to claim 1, wherein said circuit lines are about 5 to about 10 microns thick.

7. The electronic structure having embedded substantially flush circuit features, according to claim 1, wherein said seed layer comprises copper or chromium.

8. The electronic structure having embedded substantially flush circuit features, according to claim 1, wherein said seed layer is about 100 angatroms to about 5000 angstroms thick.

9. The electronic structure of claim 1 wherein said electrically conductive material is plated metal.

10. The electronic structure of claim 1 wherein the circuit lines are about 0.5 to about 1 mil wide, about 0.5 to about 2 mils apart and up to about 20 microns thick.

11. An electronic structure which comprises at least two of the structures of claim 1 stacked together.

12. The electronic structure of claim 1 wherein said trench features are formed by laser oblation.

* * * * *

UNITED STATES PATENT AND TRADEMARK OFFICE
CERTIFICATE OF CORRECTION

PATENT NO. : 6,919,514 B2 Page 1 of 1
APPLICATION NO. : 10/661552
DATED : July 19, 2005
INVENTOR(S) : John J. Konrad et al.

It is certified that error appears in the above-identified patent and that said Letters Patent is hereby corrected as shown below:

On title page

Item (74), change Ronald Kaschak to --William H. Steinberg--

Signed and Sealed this

Twenty-second Day of August, 2006

JON W. DUDAS
*Director of the United States Patent and Trademark Office*